(12) United States Patent
Afzali-Ardakani et al.

(10) Patent No.: US 9,543,534 B1
(45) Date of Patent: Jan. 10, 2017

(54) SELF-ALIGNED CARBON NANOTUBE TRANSISTOR INCLUDING SOURCE/DRAIN EXTENSIONS AND TOP GATE

(71) Applicant: International Business Machines Corporation, Armonk, NY (US)

(72) Inventors: Ali Afzali-Ardakani, Ossining, NY (US); Aaron D. Franklin, Croton-on-Hudson, NY (US); George S. Tulevski, Croton-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/949,992

(22) Filed: Nov. 24, 2015

Related U.S. Application Data

(63) Continuation of application No. 14/753,609, filed on Jun. 29, 2015.

(51) Int. Cl.
*H01L 51/00* (2006.01)
*H01L 51/05* (2006.01)
*H01L 51/10* (2006.01)

(52) U.S. Cl.
CPC ....... *H01L 51/0516* (2013.01); *H01L 51/0002* (2013.01); *H01L 51/0021* (2013.01); *H01L 51/055* (2013.01); *H01L 51/0541* (2013.01); *H01L 51/0558* (2013.01); *H01L 51/105* (2013.01); *H01L 51/0048* (2013.01)

(58) Field of Classification Search
CPC .................. H01L 51/0048; H01L 51/0512
See application file for complete search history.

(56) References Cited

U.S. PATENT DOCUMENTS 8,063,451 B2 * 11/2011 Zhang ................... B82Y 10/00
257/330

OTHER PUBLICATIONS

Afzali-Ardakani et al., "Self-Aligned Carbon Nanotube Transistor Including Source/Drain Extensions and Top Gate", U.S. Appl. No. 14/753,609, filed Jun. 29, 2015.
List of IBM Patents or Patent Applications Treated as Related; (Appendix P), Filed Feb. 2, 2016; 2 pages.

* cited by examiner

*Primary Examiner* — Mark Prenty
(74) *Attorney, Agent, or Firm* — Cantor Colburn LLP; Vazken Alexanian

(57) ABSTRACT

A carbon nanotube semiconductor device includes at least one carbon nanotube disposed on an insulator portion of a substrate. The at least one carbon nanotube includes a non-doped channel portion interposed between a first doped source/drain portion and a second doped source/drain portion. A first source/drain contact stack is disposed on the first doped source/drain portion and an opposing second source/drain contact stack is disposed on the second doped source/drain portion. A replacement metal gate stack is interposed between the first and second source/drain contact stacks, and on the at least one carbon nanotube. The first and second doped source/drain portions are each vertically aligned with an inner edge of the first and second contact stacks, respectively.

7 Claims, 11 Drawing Sheets

SELF-ALIGNED CARBON NANOTUBE TRANSISTOR INCLUDING SOURCE/DRAIN EXTENSIONS AND TOP GATE

DOMESTIC PRIORITY

This application is a continuation of U.S. patent application Ser. No. 14/753,609, filed Jun. 29, 2015, the disclosure of which is incorporated by reference herein in its entirety.

BACKGROUND

The present invention relates to semiconductor device, and more specifically, to carbon nanotube (CNT) semiconductor devices.

Semiconductor devices having a robust self-aligned device structure are desirable when fabricating carbon nanotube field-effect transistors (CNTFETs). The robust self-alignment configuration is technologically relevant for highly integrated digital applications. For example, self-aligned devices improve uniformity of key parameters such as parasitic capacitance, thus enabling uniform operation of the transistors across a chip.

Self-aligned CNTFETs are typically fabricated by leveraging a pre-formed gate region as a mask when performing ion implantation to form the source and drain contacts. Since the gate serves as the mask, the source and drain contacts are formed in direct and consistent proximity to the gate, thereby providing a self-aligned CNTFET device. Current trends in self-aligned CNTFET devices have led to the implementation of doped extensions to enhance carrier injection into the channel, which in turn improves on-state performance. Enhanced carrier injection into the channel also suppresses ambipolar conduction, i.e., reduces ambipolar diffusion of carriers from the channel, so as to improve off-state device performance. As the size of CNTFET devices continue to decrease, however, it has become more difficult to maintain the uniformity of smaller doped extensions using conventional fabrication processes.

SUMMARY

According to at least one non-limiting embodiment of the present invention, a carbon nanotube semiconductor device includes at least one carbon nanotube disposed on an insulator portion of a substrate. The at least one carbon nanotube includes a non-doped channel portion interposed between a first doped source/drain portion and a second doped source/drain portion. A first source/drain contact stack is disposed on the first doped source/drain portion and an opposing second source/drain contact stack is disposed on the second doped source/drain portion. A replacement metal gate stack is interposed between the first and second source/drain contact stacks, and on the at least one carbon nanotube. The first and second doped source/drain portions are each vertically aligned with an inner edge of the first and second contact stacks, respectively.

According to another non-limiting embodiment, a method of fabricating a carbon nanotube semiconductor device comprises forming at least one carbon nanotube on an insulating portion of a substrate. The at least one carbon nanotube includes a channel portion interposed between opposing doped source/drain portions. The method further comprises forming a contact stack atop the insulating portion to cover the at least one carbon nanotube, and forming a trench in the contact stack that extends along a first direction to expose the channel portion. The method further includes selectively etching the contact stack along a second direction opposite the first direction to form opposing buffer regions in the contact stack. The method further includes depositing a gate dielectric layer that lines the sidewalls of the trench and fills buffer regions so as to form dielectric extension regions isolate the trench from the doped source/drain portion.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Figure 1:
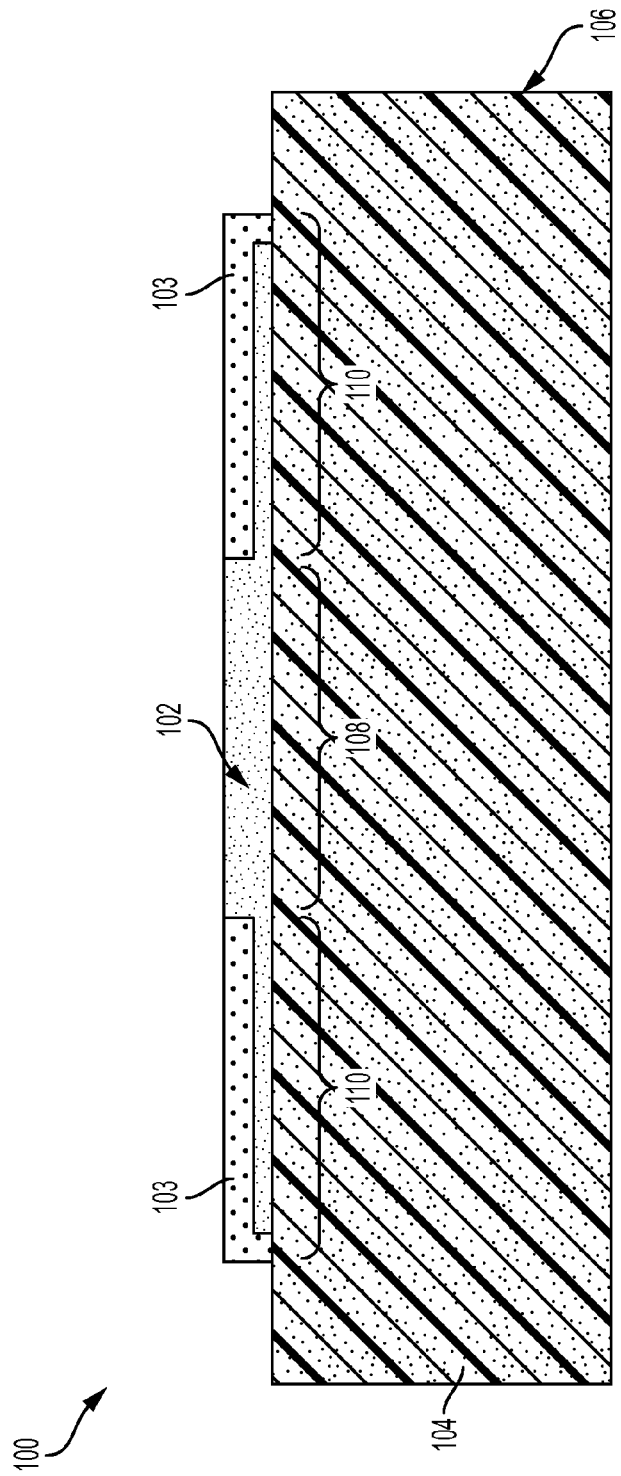
FIG. 1 illustrates an intermediate semiconductor device after performing a source/drain ion deposition process upon a carbon nanotube (CNT) formed on a substrate to define a channel portion between doped source/drain (S/D) portions.

With reference now to FIG. 1, an intermediate semiconductor device 100 is illustrated after applying a source/drain ion implantation process to a carbon nanotube (CNT) 102. More specifically, the semiconductor device 100 includes the CNT 102 formed on an insulator portion 104 of a substrate 106. The insulator portion 104 may include a buried insulator layer of a semiconductor-on-insulator (SOI) substrate, or a shallow-trench-isolation (STI) region formed in a bulk substrate. The insulator portion 104 is formed from, for example, silicon dioxide ($SiO_2$).

As mentioned above, the CNT 102 is illustrated after undergoing a well-known dopant process. The dopant process may include, for example, depositing a lithographic mask (not shown) on an upper surface of the CNT, patterning the lithographic mask to expose desired S/D regions, and depositing dopants 103 on and/or in into the exposed S/D portions of the CNT 102, and then stripping the remaining lithographic mask from the CNT 102 to expose an un-doped channel portion of the CNT 102. In this manner, a CNT 102 having an un-doped channel portion 108 interposed between doped S/D portions 110 is formed on the insulator portion 104 as further illustrated in FIG. 1. Thus, a junction is formed between the channel portion 108 and each doped S/D portion 110. The CNT 102 has a dimension of approximately 0.7 to approximately 2.0 nanometers (nm), for example. According to a non-limiting embodiment, the channel portion 108 is formed from a carbon (C)-based material, and the doped S/D portions 110 include dopants 103 formed from carbon doped with boron (B). According to another non-limiting embodiment, the channel portion 108 is formed from a carbon (C)-based material, and the doped S/D portions 110 include dopants 103 formed from carbon doped with phosphorous (P) or carbon doped with arsenic (Ar). In yet another non-limiting embodiment, the channel portion 108 is formed from a carbon (C)-based material, and the doped S/D portions 110 include, for example, triethyloxonium hexcachloroantimonate [$Et_3O+ SbCl_6$].

According to another embodiment, the channel region 108 and doped S/D regions 110 can be formed using a source/drain doping-first method. More specifically, the dopant 103 is formed on the entire CNT 102 prior to depositing the contact stacks. Subsequently, a portion of the dopant 103 is selectively removed from the channel region 108 using an appropriate heat treatment. In this manner, a CNT 102 including an un-doped channel portion 108 and doped S/D portions 110 is formed as illustrated in FIG. 1.

Figure 2:
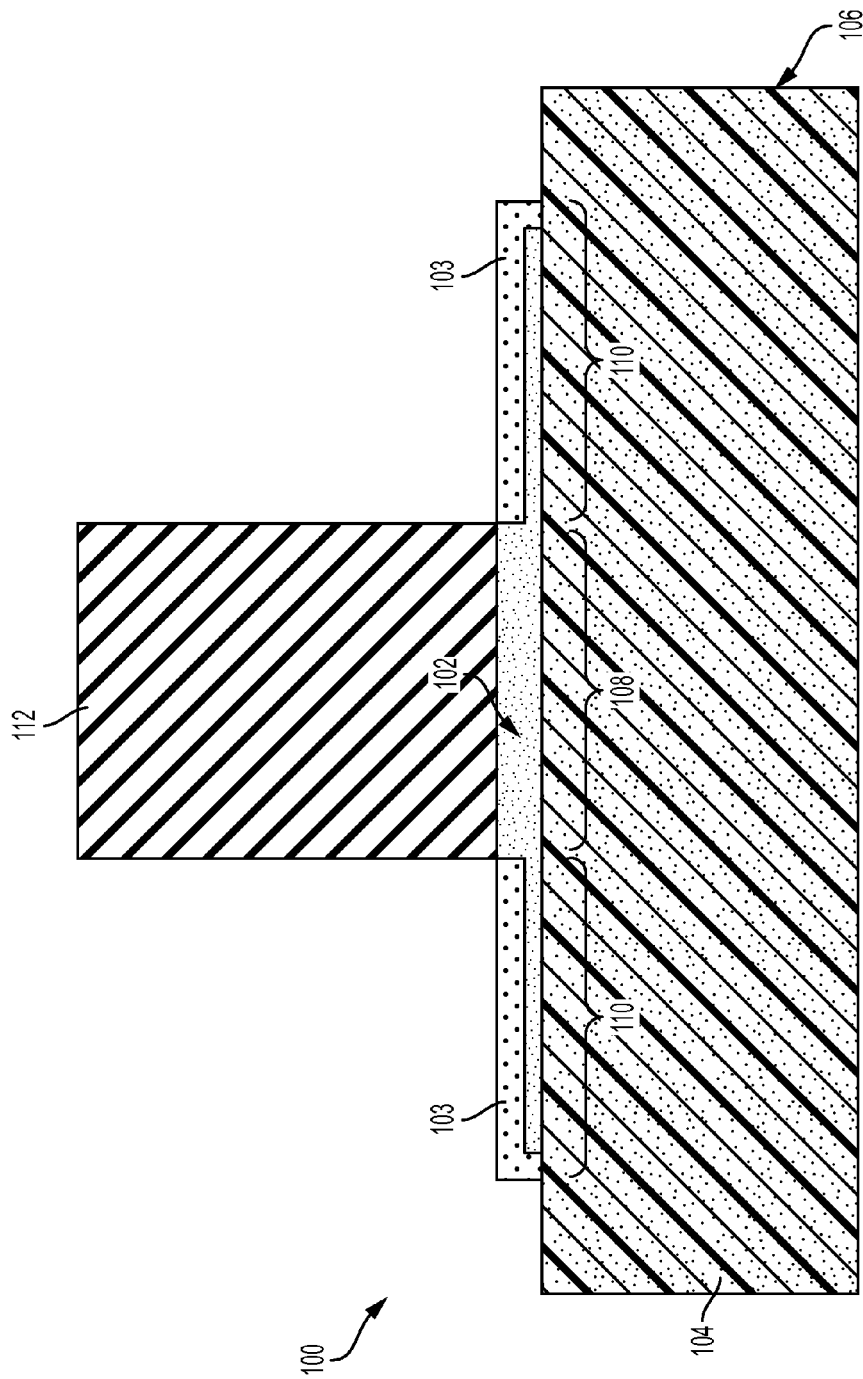
FIG. 2 illustrates the semiconductor device of FIG. 1 following formation of a dummy gate on the channel portion of the CNT.

Turning now to FIG. 2, the semiconductor device 100 is illustrated following formation of a dummy gate 112 on the channel portion 108 of the CNT 102. The dummy gate 112 may be formed according to a well-known replacement metal gate (RMG) process. The RMG process may include depositing a dummy gate material formed of polysilicon (poly-si) for example, on an upper surface of the substrate 106 to cover the CNT 102, depositing a photoresist mask (not shown) atop the dummy gate material, patterning the photoresist mask, and transferring the pattern into the dummy gate material to form the dummy gate 112. In this manner, the dummy gate 112 is formed to cover the channel portions 108 of the CNT 102, while exposing the doped S/D portions 110 as further illustrated in FIG. 2. The dummy gate 112 has a length (e.g., horizontal thickness) ranging from approximately 5 nm to approximately 20 nm, and height (e.g, vertical thickness) ranging from approximately 10 nm to approximately 0.5 nm.

Figure 3:
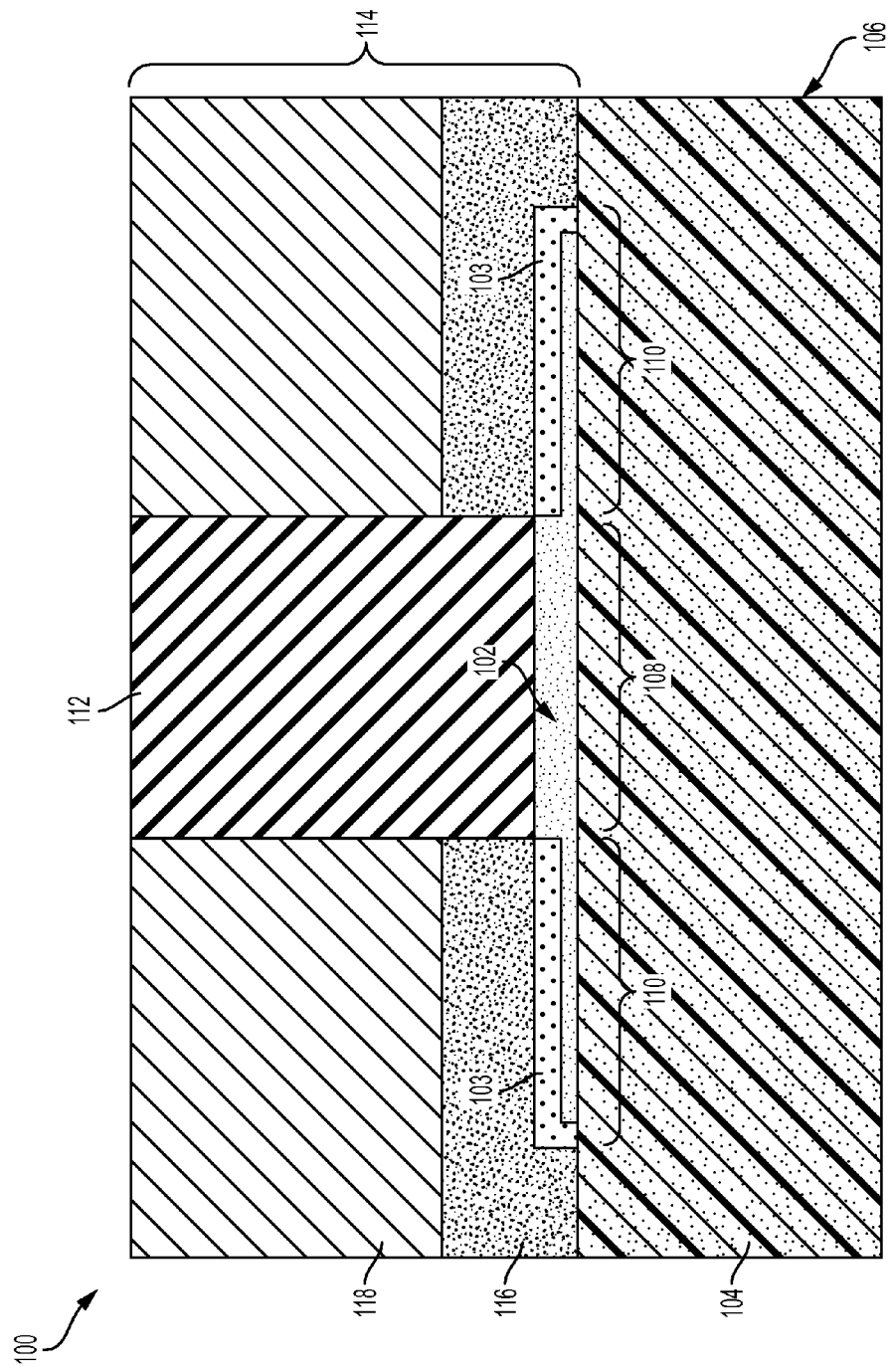
FIG. 3 illustrates the semiconductor device of FIG. 2 following deposition and planarization of a contact stack that covers the doped S/D portions of the CNT and the dummy gate.

Referring now to FIG. 3, the semiconductor device 100 is illustrated following deposition of a contact stack 114 on an upper surface of the substrate 106. According to an embodiment, the contact stack 114 can be deposited to cover doped S/D portions 110 and the dummy gate 112, and a chemical-mechanical planarization process is subsequently performed such that an upper surface of the contact stack 114 is flush with an upper surface of the dummy gate 112. In this manner, a first contact 114 (e.g., the left contact stack 114) is formed on the substrate 106 and covers a first doped S/D portion 110 (e.g., the left doped S/D portion 110), and a second contact 114 (e.g., the right contact stack 114) is formed on the substrate 106 and covers a second doped S/D portion 110 (e.g, the right doped S/D portion 110).

According to a non-limiting embodiment, the contact stack 114 includes a source/drain contact layer 116 interposed between a cap layer 118 and the substrate 106. More specifically, the S/D contact layers 116 formed of a metal material, for example, are formed on an upper surface of the insulation portion 104 to cover a respect doped S/D portion 110 of the CNT 102. The S/D contact layer 116 has a height (e.g, vertical thickness) ranging from approximately 2 nm to approximately 10 nm. The metal material may include, for example, titanium palladium (TiPd), erbium (Er), and scandium (Sc). The cap layers 118 are formed on an upper surface of the S/D contact layer 116. The cap layers 118 are formed of chromium (Cr), or silicon nitride (SiN), for example, and have a height (e.g, vertical thickness) ranging from approximately 5 nm to approximately 30 nm.

Figure 4:
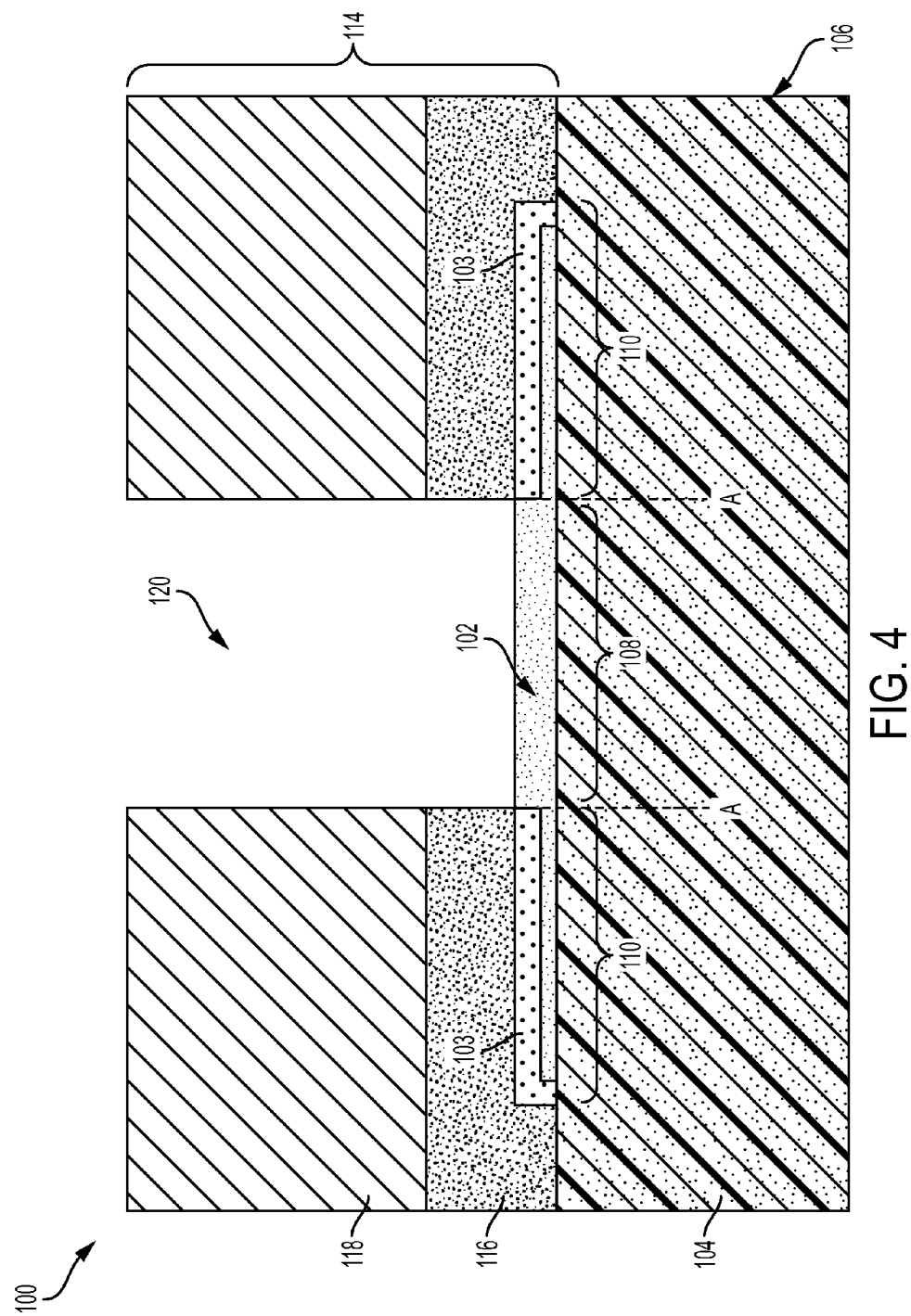
FIG. 4 illustrates the semiconductor device of FIG. 3 after removing the dummy gate to from a trench that extends through the cap layer and the contact layer, and exposes the channel portion of the CNT.

Referring to FIG. 4, the semiconductor device 100 is illustrated after removing the dummy gate (previously indicated as 112) to form a trench 120 in the contact stack 114. More specifically, the trench 120 extends through the cap layer 118 and the S/D contact layer 116 and exposes the channel portion 108 of the CNT 102. Various well-known etching processes selective to the cap layer material (e.g, Cr), the S/D contact layer metal material, and the CNT 102 (e.g., carbon) can be used to remove the dummy gate. In this manner, only the channel portion 108 is exposed while the doped S/D portions 110 remain covered by the contact stack 114.

Although a RMG process is described above to form the trench 120, it should be appreciated that other methods may be used. For example, a block contact stack 114 may be deposited on an upper surface of the substrate 106 to cover completely the CNT 102. Subsequently, the contact stack 114 may be etched stopping on an upper surface of the channel portion 108. In this manner, a trench 112 is formed through the contact stack to expose the channel portion 108.

Figure 5:
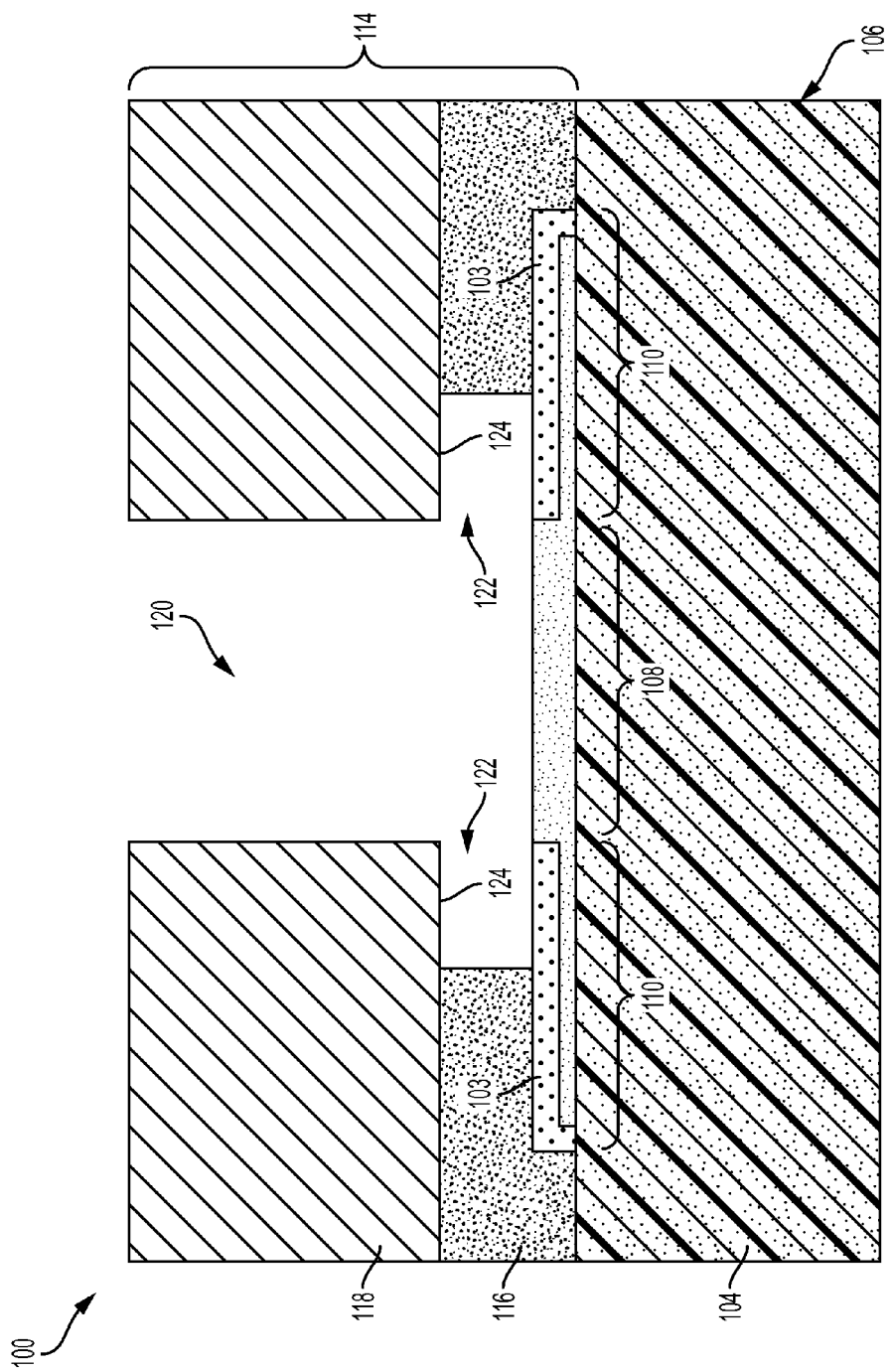
FIG. 5 illustrates the semiconductor device of FIG. 4 after performing a selective etching process that laterally recesses a portion of the contact layer beneath the cap layer to form cap overhang portions and expose the doped S/D portions.

Turning to FIG. 5, a selective etching process is performed to laterally etch a portion of the S/D contact layer 116 exposed by the trench 120. A diluted aqua regia etchant may be used so as to etch the cap layer material (e.g., Cr) while preserving the S/D contact layer material (e.g., Pd). The selective etching process results in the formation of opposing buffer regions 122 in the S/D contact layer 116. The buffer regions 122 further define opposing overhang portions 124 of the cap layer 118. The overhang portions 124 are located above buffer regions 122 and have inner edges that are vertically aligned with a respective doped S/D portion 110 of the CNT 102. The buffer regions 122 may extend from an end of the doped S/D portion 110 into the S/D contact layer 116 at a distance ranging from approximately 5 angstroms (Å) to approximately 5 nm.

Figure 6:
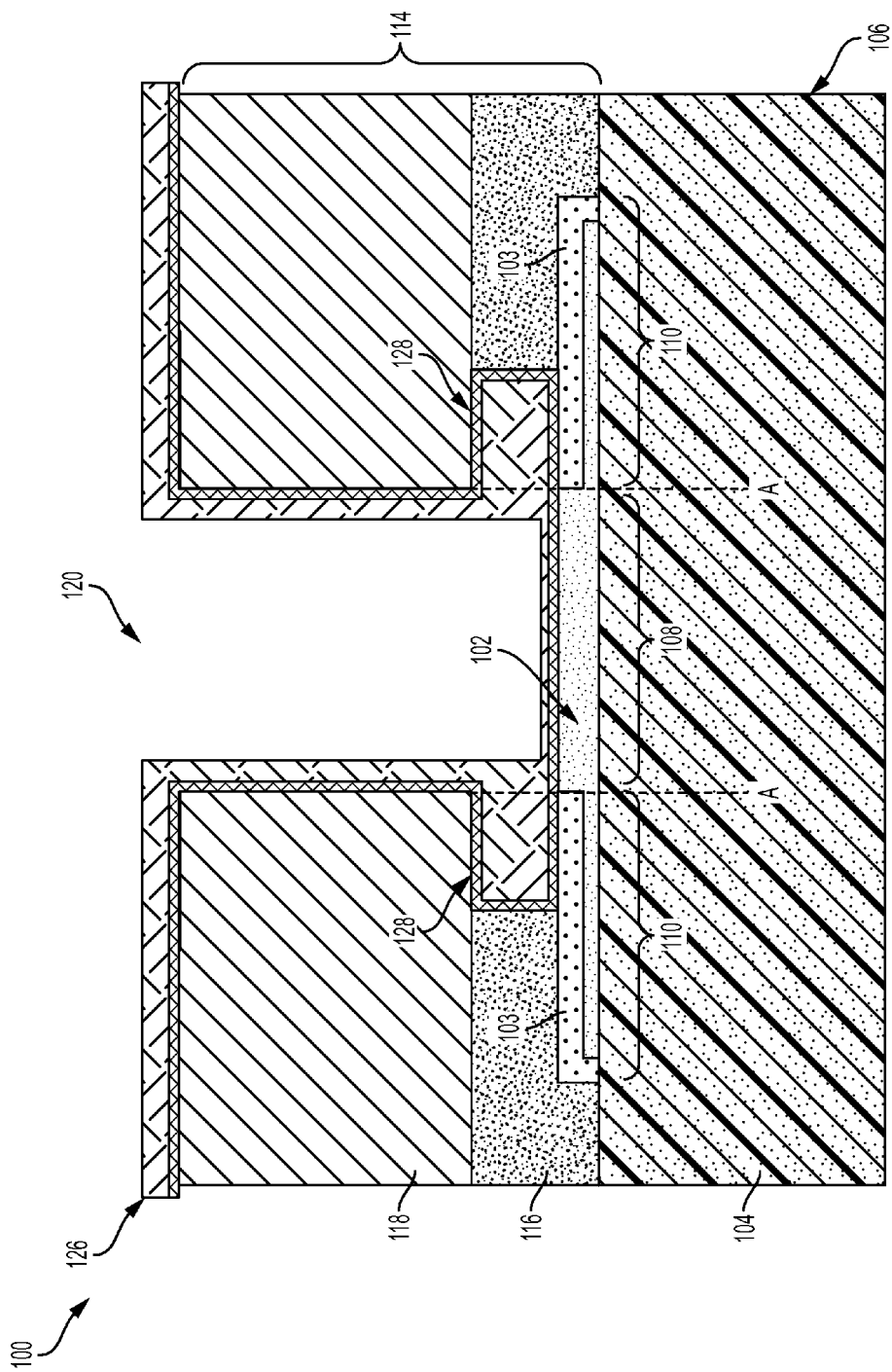
FIG. 6 illustrates the semiconductor device of FIG. 4 after depositing a conformal gate dielectric layer that lines an upper surface of the cap layer, sidewalls of the trench and recess region, and is formed on exposed uppers surfaces of the doped S/D portions and the channel portion.

Referring to FIG. 6, the semiconductor device 100 is illustrated after depositing a conformal gate dielectric layer 126 that lines an upper surface of the cap layer 118, sidewalls of the trench 120, and sidewalls of the buffer regions 122. The conformal gate dielectric layer 126 also lines the exposed upper surfaces of the doped S/D portions 110 and the channel portion 108. The conformal gate dielectric layer 126 may be deposited using atomic layer deposition (ALD), for example, and may be formed as a single layer of high-dielectric (high-k) material such as hafnium oxide ($HfO_2$), for example, or multiple high-k dielectric material layers. According to a non-limiting embodiment, the thickness of the S/D contact layer 116 is approximately two times that of the gate dielectric layer 126. For example, the S/D contact layer may have a thickness of approximately 10 nm, while the gate dielectric layer 126 has a thickness of approximately 5 nm. Accordingly, the gate dielectric layer 126 can be deposited to fill the buffer regions (previously indicated as element 122), and form first and second dielectric extension portions 128. A first extension portion 128 (e.g., left portion) is interposed between a first doped S/D portion 110 and the cap layer 118. A second extension portion 128 (e.g., right portion) is interposed between a second doped source/drain portion 110 and the cap layer 118.

Figure 7:
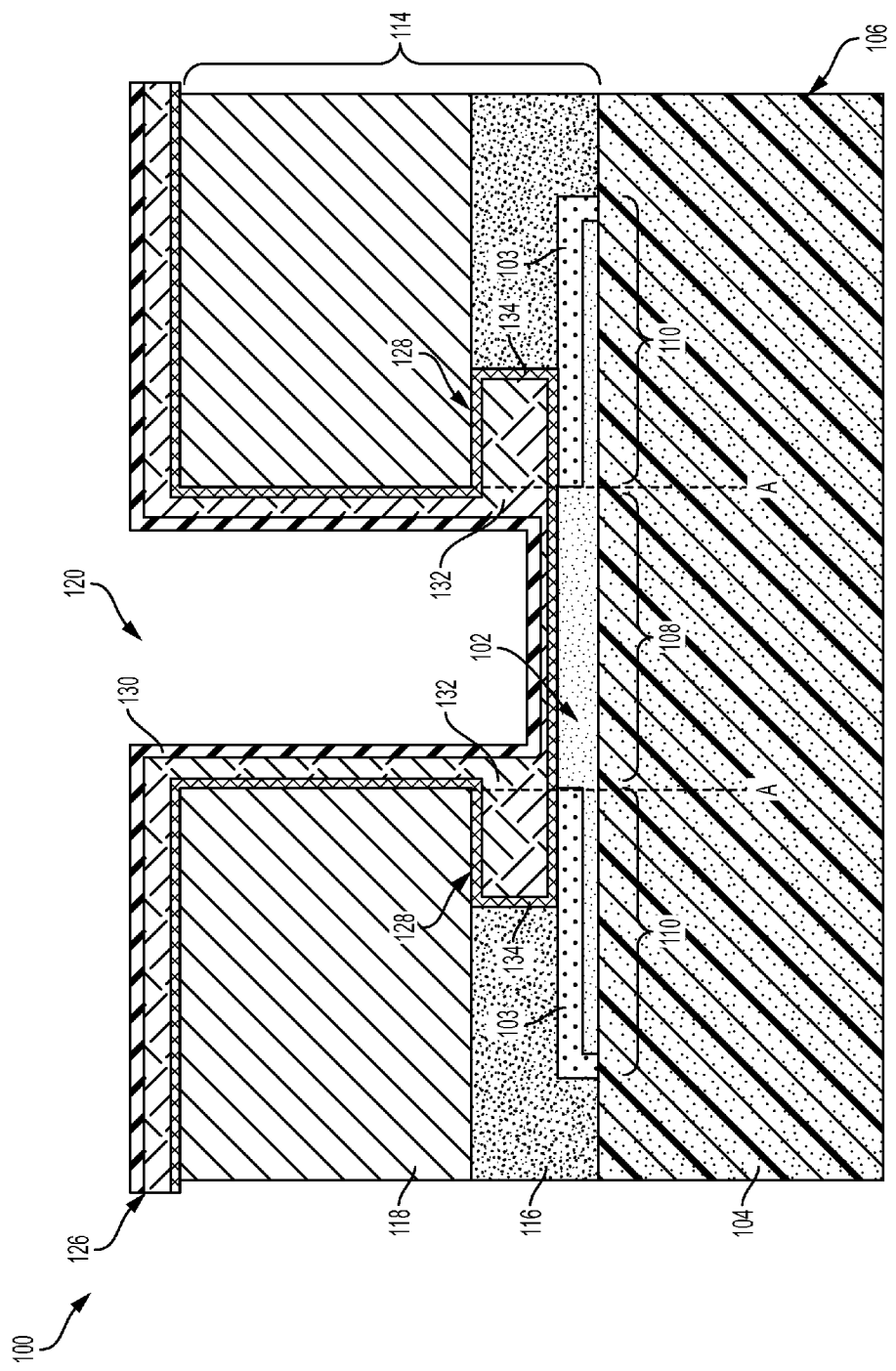
FIG. 7 illustrates the semiconductor device of FIG. 6 after depositing a conformal gate metal film on an upper surface of the gate dielectric layer.

Turning now to FIG. 7, the semiconductor device 100 is illustrated after depositing a conformal gate metal film 130 on the exposed surface of the gate dielectric layer 126. The gate metal film 130 is deposited using ALD, for example, and has a thickness ranging from, for example, approximately 0.1 nm to 10 nm. In addition, the gate metal film 130 can be formed from various materials including, but not limited to, ruthenium (Ru), tungsten (W), tantalum (Ta), titanium (Ti), tantalum nitride (TaN) and titanium nitride (TiN).

As further illustrated in FIG. 7, each extension portion 128 includes a proximate end 132 located against the gate metal film 130 and a distal end 134 opposite the proximate end 132 and located beneath the overhang portion (previously indicated as element 124). Since the extension portions 128 fill a respective buffer region 122, the distance between the proximate end 132 and the distal end 134 ranges from approximately 5 angstroms (Å) to approximately 5 nanometers (nm). The extension portions 128 further serve to prevent the metal gate film 130 from extending over the doped source/drain portions. In this manner, the doped S/D portions 110 are self-aligned with the metal gate film 130. Although a gate metal film 130 is deposited at this stage of the process flow, it should be appreciated that that gate metal film may be omitted such that the extension portions 128 can be self-aligned with a gate electrode deposited in the trench.

Figure 8:
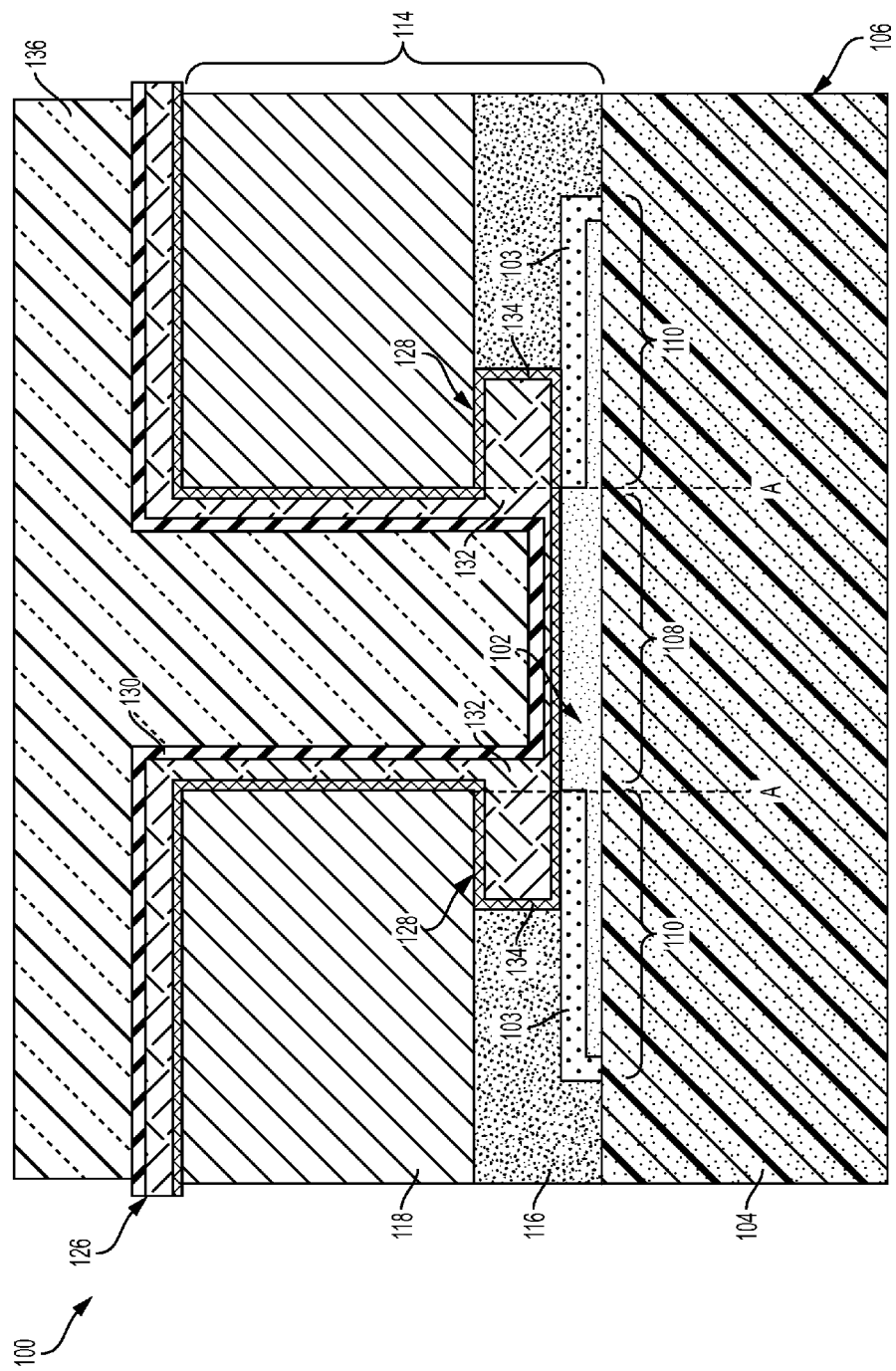
FIG. 8 illustrates the semiconductor device of FIG. 7 after depositing a gate electrode material that fills the trench and covers the upper surface of the gate metal film.

Referring to FIG. 8, a gate electrode material 136 is deposited so as to fill the trench (previously indicated as element 118), and cover an upper surface of the gate metal film 130. The gate electrode material 136 is formed from various metals including, but not limited to, tungsten (W). In this manner, the gate metal film 130 is interposed between the gate electrode material 136 and the gate dielectric layer 126.

Figure 9:
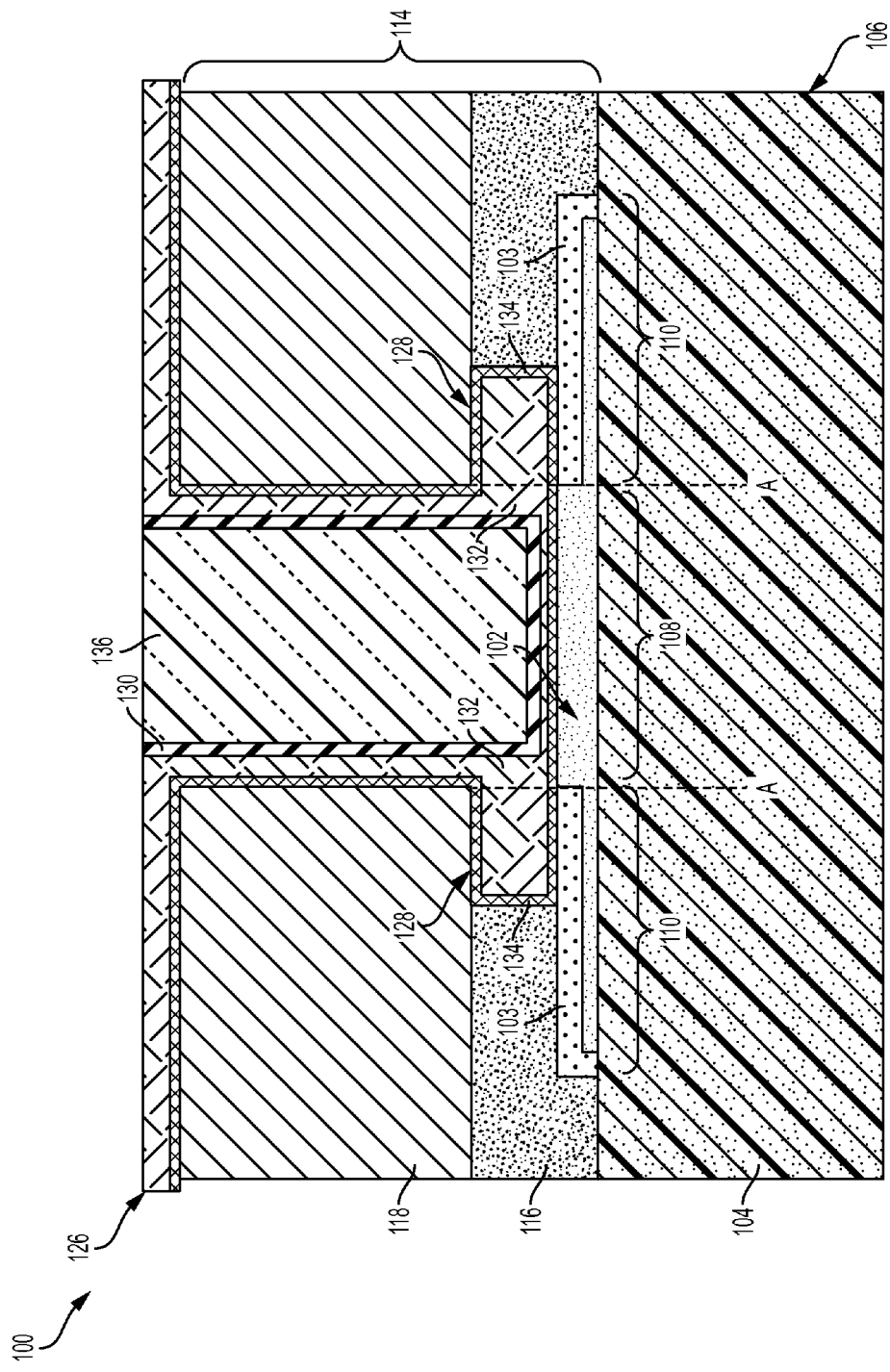
FIG. 9 illustrates the semiconductor device of FIG. 8 after performing a chemical-mechanical planarization (CMP) process that stops on an upper surface of the gate dielectric layer to planarize an upper surface of the gate electrode material with the upper surface of the gate dielectric layer and form a gate electrode atop the channel portion of the CNT.

Turning to FIG. 9, the semiconductor device 100 is illustrated following a CMP process that utilizes the gate dielectric layer 126 as an etch stop layer. In this manner, a gate electrode 136 is formed that covers the channel portion 108 of the CNT 102, and has an upper surface that is flush with the gate dielectric layer 126. Moreover, the dielectric extension portions 128 isolate the gate electrode material 136 from the doped S/D portions 110 of the CNT 102 as further illustrated in FIG. 9. In this manner, electrical shorting between the gate electrode 136 and the doped S/D portions 110 is prevented.

Figure 10:
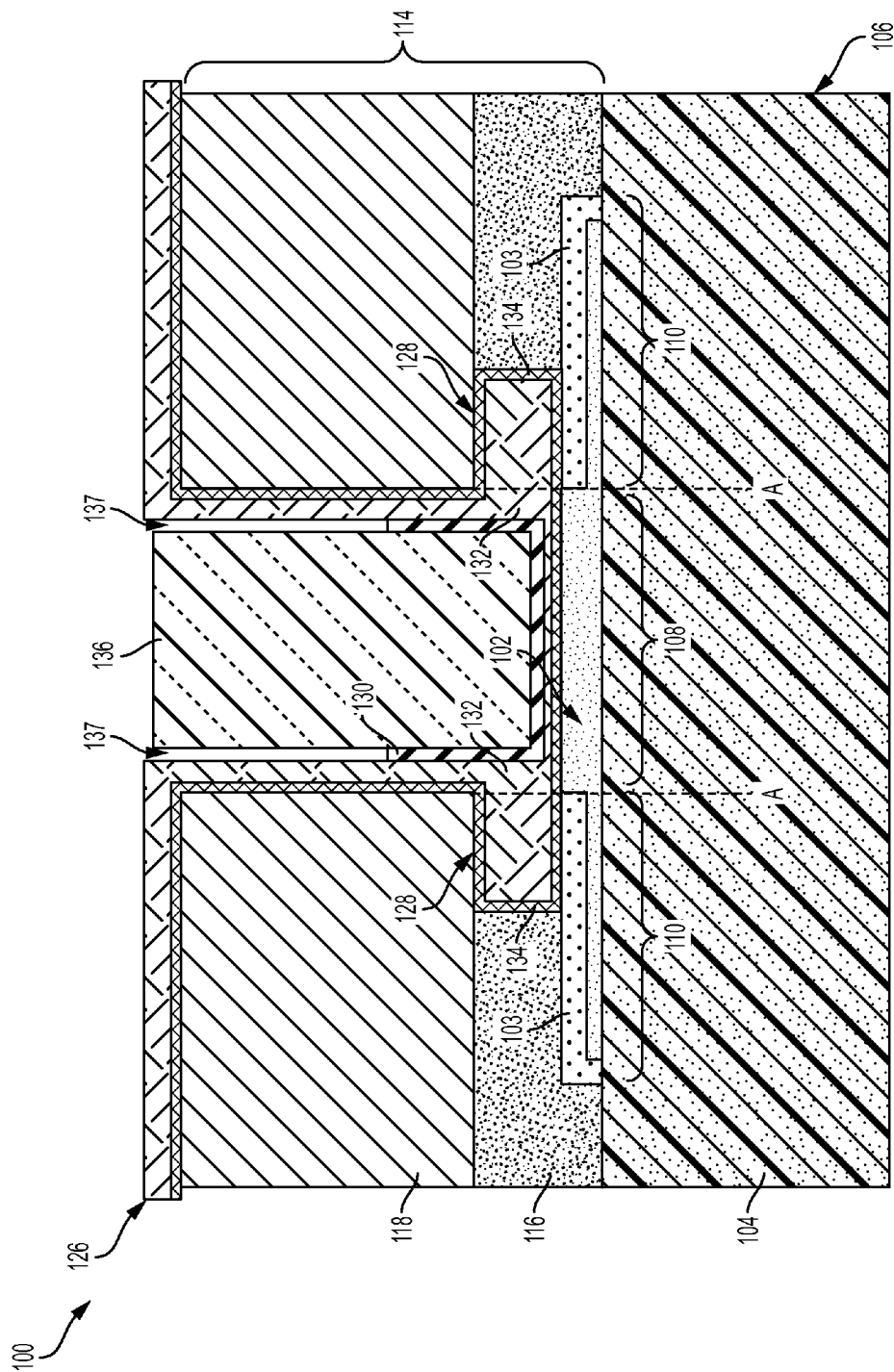
FIG. 10 illustrates the semiconductor device of FIG. 9 after selectively recessing a portion of the gate metal film formed on sidewalls of the gate electrode to adjust a parasitic capacitance between the gate electrode and the S/D contacts.

Referring to FIG. 10, the semiconductor device 100 is illustrated following an optional etching process that recesses a portion of the gate metal film 130 below the upper surface of the gate electrode 136. A selective reactive ion etch (RIE) process may be used to recess the gate metal film 130 and form voids 137 between the gate electrode 132 and the gate dielectric layer 125, while preserving the gate dielectric layer and the gate electrode 136. In this manner, a parasitic capacitance of the semiconductor device can be adjusted as understood by one of ordinary skill in the art.

Figure 11:
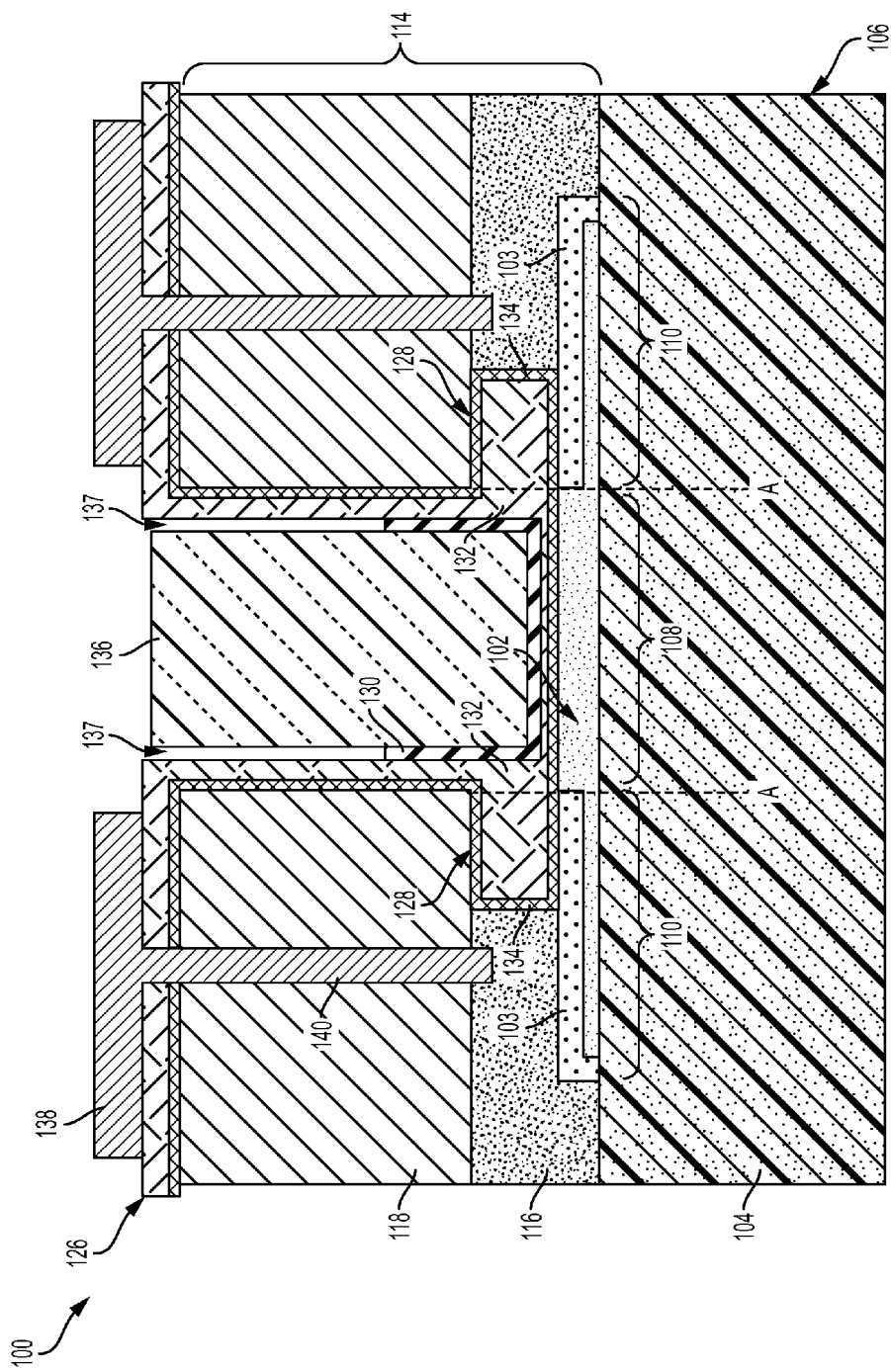
FIG. 11 illustrates the semiconductor device of FIG. 10 after forming source/drain electrodes atop the contact stack.

Turning now to FIG. 11, gate contacts 138 are formed on the upper surface of the gate dielectric layer 126. The gate contacts 138 are connected to the underlying S/D contact layer 116 using an electrically conductive via 140. In this manner, an electrical connection with the doped S/D portions 110 embedded in the S/D contact layers 116 is established.

Accordingly, various non-limiting embodiments of the invention provide a carbon nanotube field effect transistor device including a carbon nanotube having doped source/drain portions that are self-aligned with the gate electrode. In addition, the semiconductor device includes dielectric extension portions that isolate the gate electrode from the doped source/drain portions of the carbon nanotube. In this manner, electrical shorting between the gate electrode and the doped source/drain portions is prevented.

As used herein, the term module refers to a hardware module including an Application Specific Integrated Circuit (ASIC), an electronic circuit, a processor (shared, dedicated, or group) and memory that execute one or more software or firmware programs, a combinational logic circuit, and/or other suitable components that provide the described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a carbon nanotube semiconductor device, the method comprising:
    forming at least one carbon nanotube on an insulating portion of a substrate, the at least one carbon nanotube including a channel portion interposed between opposing doped source/drain portions;
    forming a contact stack atop the insulating portion to cover the at least one carbon nanotube, and forming a trench in the contact stack that extends along a first direction to expose the channel portion;
    selectively etching the contact stack in the first direction to form opposing buffer regions in the contact stack on opposite sides of the trench; and
    depositing a gate dielectric layer that lines the sidewalls of the trench and fills the buffer regions so as to form dielectric extension regions that isolate the trench from the doped source/drain portions.

2. The method of claim 1, further comprising filling the trench with a gate electrode, wherein the buffer regions electrically isolate the doped source/drain portions from the gate electrode.

3. The method of claim 2, wherein the filling the trench includes depositing a metal gate film on the gate dielectric layer, wherein the dielectric extension regions prevent the metal gate film from extending over the doped source/drain portions so as to self-align the gate electrode with the doped source/drain portions.

4. The method of claim 3, wherein selectively etching the contact stack includes forming a first overhang portion that is vertically aligned with a first junction between a first doped source/drain portion and the channel portion, and includes a second overhang portion that is vertically aligned with a second junction between a second doped source/drain portion and the channel portion.

5. The method of claim 4, further comprising selectively recessing a portion of the metal gate film below the gate electrode to adjust a parasitic capacitance of the carbon nanotube semiconductor device.

6. The method of claim 4, wherein depositing the gate dielectric layer includes forming extension portions extending from opposing sides of the gate dielectric layer, wherein each extension portion includes a proximate end contacting the gate metal film and a distal end opposite the proximate end and located beneath a respective overhang portion.

7. The method of claim 1, wherein the forming a trench includes performing a replacement metal gate process that removes a dummy gate from atop the channel portion to form the trench.

* * * * *